(12) United States Patent
Oosterlaken et al.

(10) Patent No.: US 11,869,786 B2
(45) Date of Patent: Jan. 9, 2024

(54) WAFER BOAT

(71) Applicant: ASM IP Holding B.V., Almere (NL)

(72) Inventors: Theodorus G. M. Oosterlaken, Oudewater (NL); Chaggai Ganani, Almere (NL)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/592,181

(22) Filed: Feb. 3, 2022

(65) Prior Publication Data
US 2022/0254668 A1 Aug. 11, 2022

Related U.S. Application Data

(60) Provisional application No. 63/146,870, filed on Feb. 8, 2021.

(51) Int. Cl.
| | | |
|---|---|---|
| *H01L 21/673* | (2006.01) | |
| *H01L 21/677* | (2006.01) | |
| *H01L 21/68* | (2006.01) | |
| H01L 21/67 | (2006.01) | |
| H01L 21/683 | (2006.01) | |

(52) U.S. Cl.
CPC .. *H01L 21/67309* (2013.01); *H01L 21/67303* (2013.01); *H01L 21/67757* (2013.01); *H01L 21/68* (2013.01); *H01L 21/67098* (2013.01); *H01L 21/67313* (2013.01); *H01L 21/683* (2013.01)

(58) Field of Classification Search
CPC ......... H01L 21/67309; H01L 21/67098; H01L 21/67303; H01L 21/67313; H01L 21/67757; H01L 21/68; H01L 21/683
See application file for complete search history.

(56) References Cited

U.S. PATENT DOCUMENTS

| | | | | |
|---|---|---|---|---|
| 5,482,558 A | * | 1/1996 | Watanabe | H01L 21/67309 118/724 |
| 6,488,497 B1 | * | 12/2002 | Buckley | H01L 21/67309 211/41.18 |

(Continued)

FOREIGN PATENT DOCUMENTS

| | | | | |
|---|---|---|---|---|
| CN | 104253077 A | * | 12/2014 | ....... H01L 21/67309 |
| EP | 843338 A1 | * | 5/1998 | ........ H01L 21/67115 |

*Primary Examiner* — Steven B McAllister
*Assistant Examiner* — Benjamin W Johnson
(74) *Attorney, Agent, or Firm* — Snell & Wilmer L.L.P.

(57) ABSTRACT

A wafer boat configured to be placed on a pedestal of a vertical batch furnace, the pedestal having a substantially flat support surface. The wafer boat comprises a support ring defining a substantially flat bottom end surface of the wafer boat, and an alignment ring substantially concentric with the support ring. Either the support surface of the pedestal, or a bottom side of the alignment ring is provided with a plurality of alignment elements respectively protruding upwards from the support surface or downwards from the alignment ring, while the other one is provided with a plurality of alignment openings configured to accommodate therein the plurality of alignment elements. The support ring downwardly protrudes beyond the alignment ring so that, when the wafer boat is placed on the pedestal, the support ring is supported on the support surface while the alignment ring is spaced from the support surface of the pedestal.

18 Claims, 3 Drawing Sheets

(56) References Cited

U.S. PATENT DOCUMENTS

| | | | |
|---|---|---|---|
| 6,537,011 B1 | 3/2003 | Wang | |
| 6,679,194 B2 * | 1/2004 | Ham | H01L 21/67396 |
| | | | 211/41.18 |
| 6,780,251 B2 * | 8/2004 | Tometsuka | C23C 16/4583 |
| | | | 392/416 |
| 7,207,763 B2 * | 4/2007 | Lee | H01L 21/67303 |
| | | | 414/217 |
| D600,221 S * | 9/2009 | Sato | D13/182 |
| D600,222 S * | 9/2009 | Sato | D13/182 |
| 7,798,811 B2 * | 9/2010 | Nitadori | F27B 17/0025 |
| | | | 432/5 |
| 10,014,199 B2 * | 7/2018 | Nagata | H01L 21/67769 |
| 2003/0068219 A1 * | 4/2003 | Boonstra | H01L 21/67303 |
| | | | 414/935 |
| 2015/0303091 A1 | 10/2015 | Ruda Witt | |
| 2016/0013086 A1 | 1/2016 | Yang et al. | |
| 2018/0274862 A1 | 9/2018 | Liu | |

* cited by examiner

WAFER BOAT

CROSS-REFERENCE TO RELATED APPLICATIONS

This application claims priority to U.S. Provisional Patent Application Ser. No. 63/146,870 filed Feb. 8, 2021 titled WAFER BOAT, the disclosure of which is hereby incorporated by reference in its entirety.

FIELD

The present disclosure generally relates to a wafer boat configured to support a plurality of wafers and to be placed on a pedestal of a vertical batch furnace.

BACKGROUND

Most vertical batch furnaces are provided with a pedestal for supporting a wafer boat and for transferring said wafer boat to a process chamber. Typically, the wafer boat is placed on small cylindrical feet on the pedestal. The pedestal may vertically transfer the wafer boat into a processing position in the process chamber.

SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

It is realized that it may be required to position the wafer boat straight and concentric with respect to the process chamber, in order to obtain a uniform processing of the wafers in the wafer boat, e.g. a uniform deposition of material on the surfaces of the wafers in the wafer boat. When a wafer boat is placed upon a pedestal of a vertical batch furnace, the bottom or contact surface may therefore need to have a high level of flatness. The high level of flatness will prevent tilt of the wafer boat and make a straight alignment between wafer boat and process chamber possible. Not having a sufficient level of flatness may result in a tilted wafer boat with respect to the process chamber, which may, for example, result in a non-uniform deposition in said process.

It may further be desirable that the contact surface between the wafer boat and the pedestal is small. A small contact surface may minimize heat conduction from the wafer boat to the pedestal, and thus minimize heat losses.

Therefore, it may be an object to provide a wafer boat that may be provided with an alignment system relative to a pedestal, which may achieve a sufficient level of flatness, may allow rotation of the pedestal with the wafer boat placed upon said pedestal, and may minimize heat losses.

To that end, there may be provided a wafer boat according to claim 1. More particularly, there may be provided a wafer boat configured to support a plurality of wafers and to be placed on a pedestal of a vertical batch furnace. The pedestal may have a substantially flat support surface. The wafer boat may define a central wafer boat axis which, when the wafer boat is placed on the pedestal, may extend substantially vertically. The wafer boat may comprise a support ring and an alignment ring. The support ring may define a bottom end surface of the wafer boat which is substantially flat. The alignment ring may be substantially concentric with the support ring. Either the support surface of the pedestal, or a bottom side of the alignment ring may be provided with a plurality of alignment elements respectively protruding upwards from the support surface or downwards from the alignment ring. The other one of the support surface and the alignment ring may be provided with a plurality of alignment openings configured to accommodate therein the plurality of alignment elements. The support ring may downwardly protrude beyond the alignment ring in the direction of the central wafer boat axis so that, when the wafer boat is placed on the pedestal, the support ring may be supported on the support surface while the alignment ring may be spaced from the support surface of the pedestal.

There may also be provided an assembly for aligning and rotating wafer boats according to claim 17. The assembly may comprise a wafer boat according to the description, and a pedestal. The pedestal may comprise a substantially flat support surface and either a plurality of alignment elements protruding upwards from said support surface configured to be accommodated in the plurality of alignment openings in the alignment ring, or a plurality of alignment openings configured to accommodate therein the plurality of alignment elements on the alignment ring.

There may further be provided a vertical batch furnace assembly for processing wafer according to claim 19. The vertical batch furnace assembly may comprise a process chamber, a wafer handling space, and a wafer boat handling device. The process chamber may be configured to apply a thermal or chemical treatment to a batch of wafers. The wafer handling space may be provided with the assembly according to the description. The wafer boat handling device may be configured to transfer the assembly between the wafer handling space and the process chamber.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

Various embodiments are claimed in the dependent claims, which will be further elucidated with reference to an example shown in the figures. The embodiments may be combined or may be applied separate from each other.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION

Figure 1:
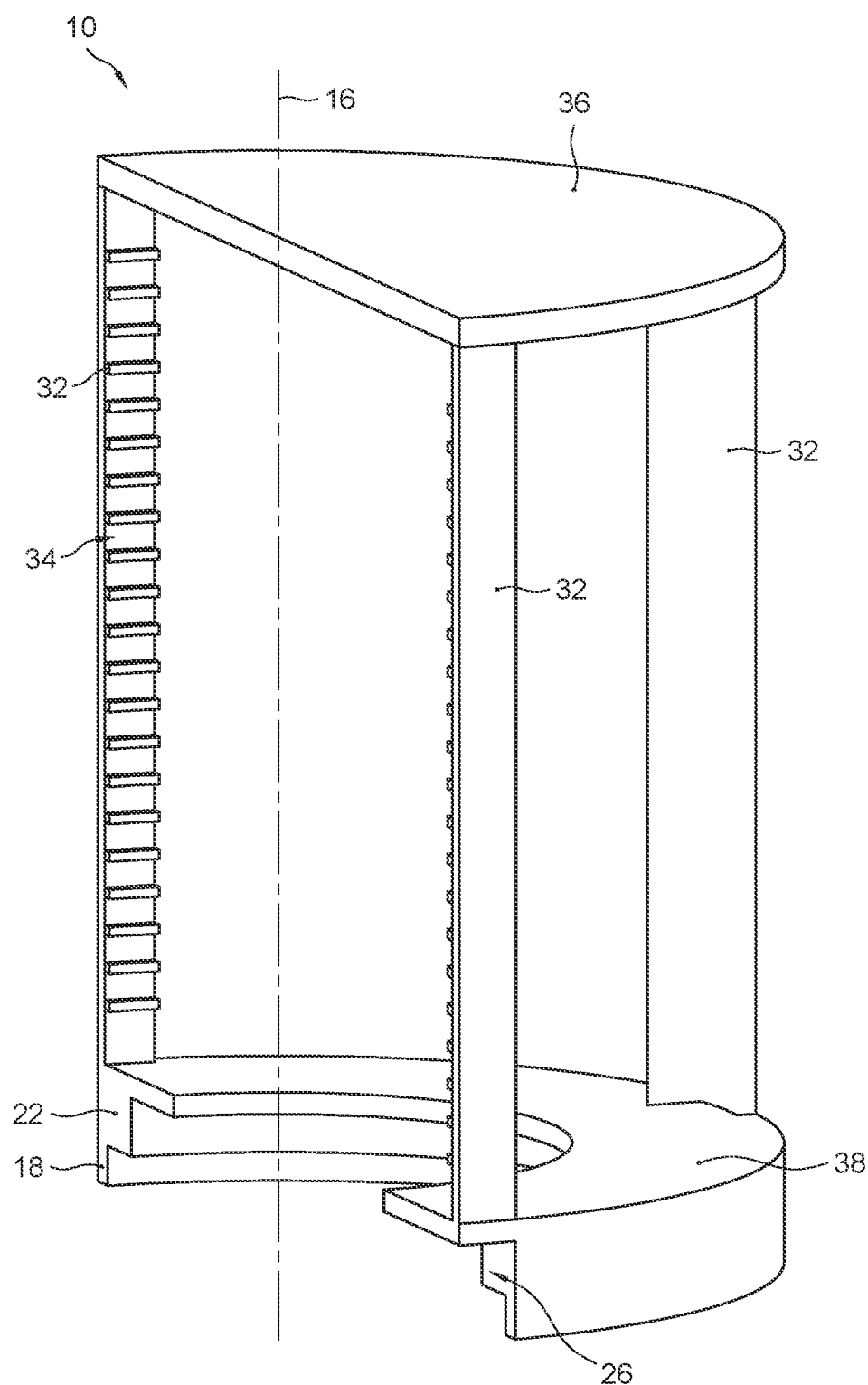
FIG. 1 shows a cross-sectional perspective view of an example of a wafer boat according to the description.
Figure 2:
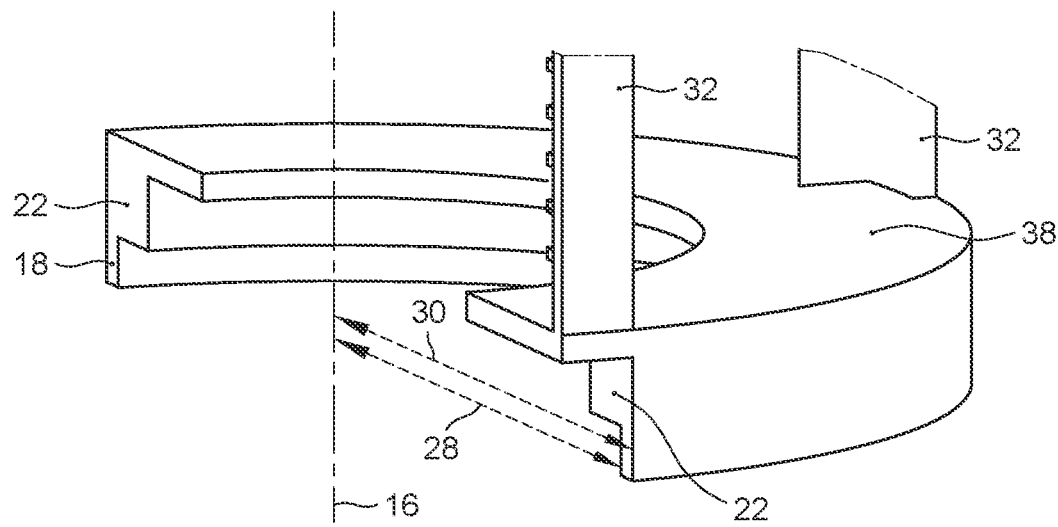
FIG. 2 shows a bottom detail of FIG. 1.
Figure 3:
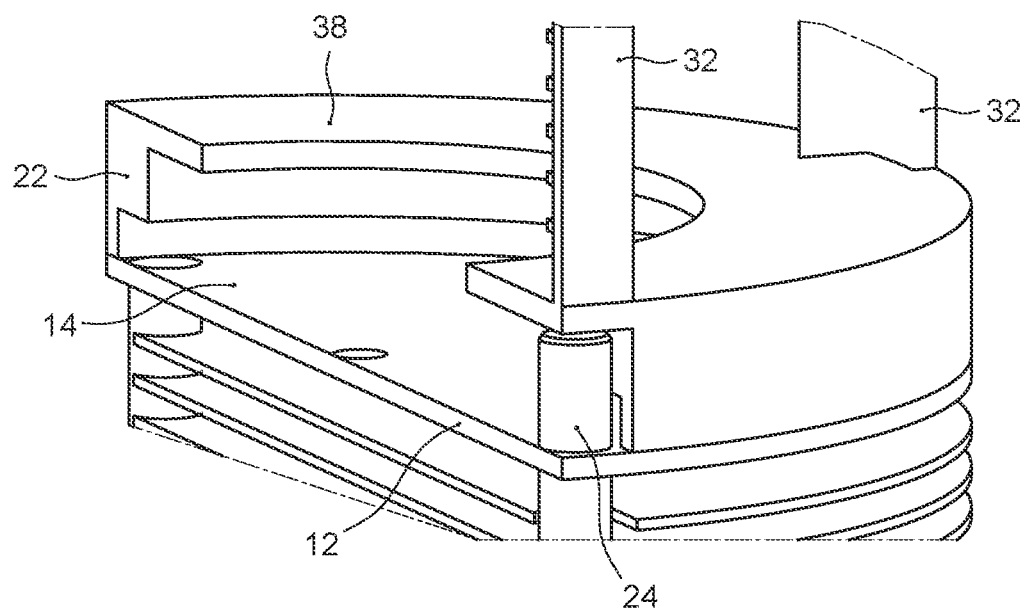
FIG. 3 shows the bottom detail of the wafer boat example in perspective cross-sectional view as shown in FIG. 2 while being placed on a pedestal which is also shown in a cross-sectional view.

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. The illustrations presented herein are not meant to be actual views of any particular material, structure, or device, but are merely idealized representations that are used to describe embodiments of the disclosure.

As used herein, the term "wafer" may refer to any underlying material or materials that may be used, or upon which, a device, a circuit, or a film may be formed.

In the most general terms the present disclosure may provide a wafer boat 10. The wafer boat may be configured to support a plurality of wafers and the wafer boat may be configured to be placed on a pedestal 12 of a vertical batch furnace. The pedestal 12 may have a substantially flat support surface 14. The wafer boat 10 may define a central wafer boat axis 16 which, when the wafer boat 10 is placed on the pedestal 12, may extend substantially vertically. The wafer boat 10 may comprise a support ring 18 and may comprise an alignment ring 22. The support ring 18 may define a bottom end surface 20 of the wafer boat 10 which is substantially flat. The alignment ring 22 may be substantially concentric with the support ring 18. Either the support surface 14 of the pedestal 12, or a bottom side of the alignment ring 22 may be provided with a plurality of alignment elements 24 respectively protruding upwards from the support surface 14 or downwards from the alignment ring 22. The other one of the support surface 14 and the alignment ring 22 may be provided with a plurality of alignment openings 26 configured to accommodate therein the plurality of alignment elements 24. The support ring 18 may downwardly protrude beyond the alignment ring 22 in the direction of the central wafer boat axis 16 so that, when the wafer boat 10 is placed on the pedestal 12, the support ring 18 may be supported on the support surface 14 while the alignment ring 22 may be spaced from the support surface 14 of the pedestal 12.

Making use of the support ring 18 and the alignment ring 22, the pedestal 12 may exert different forces on the wafer boat 10 during placement on the pedestal 12 and once being placed on the pedestal 12. The pedestal 12 may exert a vertical force for supporting and lifting the wafer boat 10. The pedestal 12 may also exert a transversal, horizontal force to rotate the wafer boat 10. The pedestal 12 may further exert forces in a horizontal plane, to translate the wafer boat 10 in said horizontal plane. The pedestal 12 may also exert horizontal forces to move the wafer boat 10 with respect to pedestal 12 in order to align said wafer boat 10 to the correct position on the pedestal 12.

The protruding alignment elements 24 and alignment openings 26 may form an alignment system which may enable the wafer boat 10 to be placed in the right position and rotational angle with respect to the pedestal 12 and, consequently, with respect to the process chamber as well. By carefully selecting the placement of the alignment elements 24 and matching alignment openings 26, a precise placement may be achieved. When the wafer boat 10 is placed upon the pedestal 12, the alignment elements 24 may slip into the alignment openings 26, causing the wafer boat 10 to align with the pedestal 12.

When placed upon the pedestal 12, the support ring 18 is configured to receive the vertical, supporting force. At the same time, the alignment openings 26 or alignment elements 24 in or on the alignment ring 22 will be able to receive a horizontal force from the pedestal 12. The matching alignment elements 24 and alignment openings 26 may enable the transfer of a rotating motion to the wafer boat 10. The alignment elements 24 may e.g. be implemented as a protrusion or rod, and the opening as a matching hole. Of course, the engagement between alignment elements 24 and alignment openings 26 may also be used to induce a translation onto the wafer boat 10, or a combination of a translation and a rotation.

The wafer boat 10 may rest with the bottom end surface 20 of its support ring 18 on the support surface 14 of the pedestal 12. There may be one single contact surface between the wafer boat 10 and the pedestal 12. In contrast, the small feet of the known wafer boat may each have a contact surface which is independent of the contact surface of another small foot. With these independent contact surfaces it may be difficult to reach a sufficient level of flatness. Because there may be one single contact surface, it may be easier to manufacture said surface and achieve the sufficient level of flatness needed for alignment of the wafer boat 10 than with a plurality of contact surfaces of a corresponding plurality of feet.

Conductive heat losses may only travel though the bottom end surface 20 to the support ring 18. By using a support ring 18, it is possible to choose a radial width of the ring 18 such that this conductive heat loss is minimized.

In an embodiment, the support ring 18 may be annular and may have an inner radius 28 and an outer radius 30. The difference between the inner radius 28 and the outer radius 30 may be less than 10 mm, preferably between 4 to 5 mm.

By virtue of the small radial width, the relatively thin support ring 18 may have a relatively small bottom end surface 20. The radial width may need to be enough to offer support for the wafer boat, while the small bottom end surface may minimize heat conduction losses from the wafer boat 10 to the pedestal 12.

In an embodiment the support ring 18 and the alignment ring 22 may be integrally formed.

With such an integrally formed implementation, the support ring 18 and alignment ring 22 may be fixed relative to each other, which means that relative alignment when constructing the wafer boat 10 is not necessary anymore. Furthermore, friction and wear between the parts during use is avoided. Which means tiny particles or debris, which may contaminate wafers in the wafer boat, do not originate.

In an embodiment the alignment elements 24 may be provided on the support surface 14. The plurality of alignment openings 26 may be provided in the alignment ring 22 and may extend through the support ring 18. Alternatively, the alignment elements 24 may be provided on the bottom side of the alignment ring 22, and the plurality of alignment openings 26 may be provided in the support surface 14 of the pedestal 12. It may also be possible that one or more of the plurality of alignment elements 24 is provided on the support surface 14, while another part of the plurality of alignment elements 24 is provided on the bottom side of the alignment ring 22.

In an embodiment, of which examples are shown in the figures, the alignment elements 24 may be provided on the support surface 14. The plurality of alignment openings 26 may be embodied as slots 26 through the alignment ring 22 and optionally the support ring 18. Each slot 26 may be a substantially straight slot 26, having a slot axis 32. Each slot axis 32 may extend through a center point of the alignment ring 22 and optionally the support ring 18 and may extend radially outwardly. The plurality of slots 26 may comprises three slots 26 which may be circumferentially spaced over intermediate angles of substantially 105° to 135° along the circumference of the alignment ring. The intermediate angles may be e.g. substantially 110°, substantially 120°, and substantially 130°.

Figure 4:
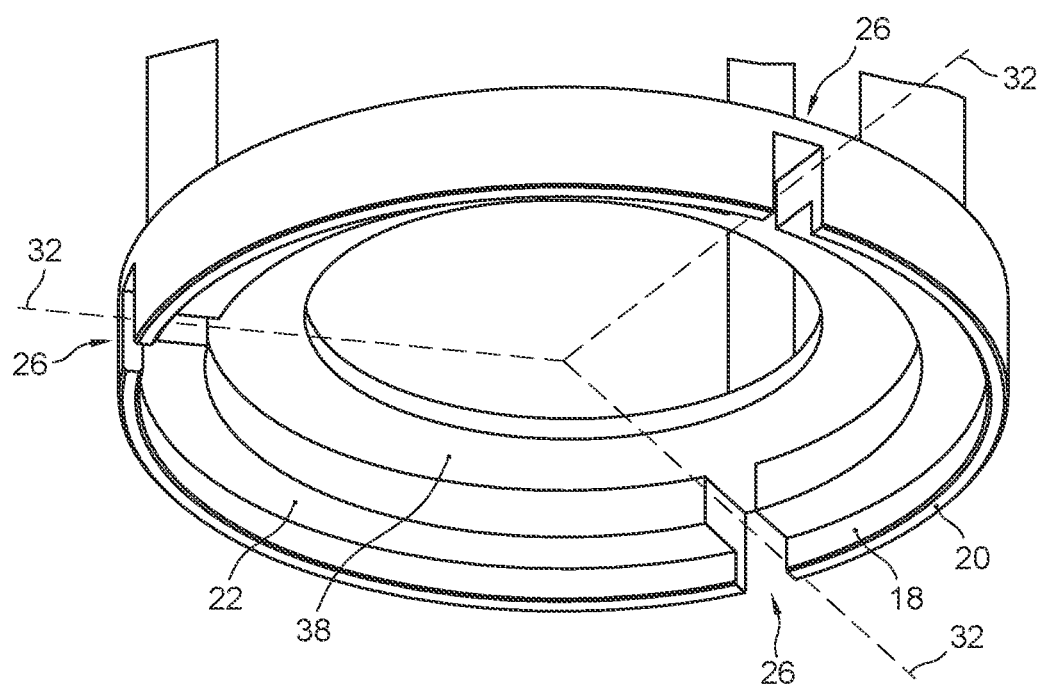
FIG. 4 shows bottom view of an example of the wafer boat according to the description.

The slots 26 and alignment elements 24 may be arranged such that the placement of the wafer boat 10 onto the pedestal 12 may be unique. Because the slots 26 may have an elongated shape, the protruding alignment elements 24 may be moveable within the length of the slot 26, but not within the width. By carefully selecting the placements of the slots 26, the position of the wafer boat 10 with respect to the pedestal 12 may be exactly determined, while the fixation may not be overconstrained. By having slot axes 32 extending though a center point, as shown in the example of FIG. 4, the wafer boat 10 may be aligned with respect to that center point. Three slots 26 may suffice to precisely align the wafer boat 10 with respect to the pedestal 12, and to prevent relative movement with respect to each other. By having the three angles almost but not entirely evenly spread out, only one rotational position of the wafer boat 10 with respect to the pedestal 12 is possible.

In an alternative embodiment the alignment elements 24 may be provided on the alignment ring 22, and the plurality of alignment openings 26 may be embodied as slots in the support surface 14.

This configuration of alignment elements 24 and alignment openings 26 may have the same effect and advantages as the embodiment in which the alignment elements 24 are provided on the pedestal 12, and the slots 26 are provided in the alignment ring 22.

In an embodiment a width of each slot 26 may be such that each alignment element 24 snugly fits within its respective slot 26 so that radial movement of the element in the associated slot 26 is possible and movement of the element in a tangential direction of the alignment ring 22 is prevented.

By having multiple slots 26, particular three slots 26, at an angle with each other, the position of the wafer boat 10 relative to the pedestal 12 is defined without being overconstrained. These effects apply likewise to both the embodiment in which the protruding alignment elements 24 are provided on the support surface 14 and the alignment openings 26 are provided in the alignment ring 22, as well as the embodiment in which the protruding alignment elements 24 are provided on the alignment ring 22 and the alignment openings 26 are provided in the support surface 14.

In an embodiment, of which an example is shown in FIG. 1, the wafer boat 10 may further comprise at least two posts 34, preferably three posts 34, which are connected to, and extend upwardly from the alignment ring 22 parallel to the central wafer boat axis 16. Each post 34 may comprises a plurality of slits 34 for supporting a plurality of wafers. The wafer boat may further comprise a top plate 36 which is connected to upper ends of the at least two posts 32. The wafer boat 10 may also comprise a bottom plate 38 which extends inwardly from the alignment ring 22 and which may be concentric with the alignment ring 22. The support ring 18, the alignment ring 22, and the bottom plate 38 may be integrally formed.

As with the integrally formed support ring 18 and alignment ring 22, the integrally formed support ring 18, alignment ring 22, and bottom plate 38 may be fixed relative to each other, which means relative alignment when constructing the wafer boat 10 is not necessary anymore. Furthermore, friction and wear between the parts during use is avoided. Which means particles or debris, which may contaminate wafers in the wafer boat, do not originate.

The posts 34 may extend vertically. The top plate 36 may stabilize the upwardly extending posts 34. The plurality of slits 34 may be evenly spaced apart such that the supported wafers are at equal distances from each other. This may further promote a uniform deposition process.

In an embodiment, of which examples are shown in the figures, the support ring 18 may be configured radially outwardly of the alignment ring 22.

In this embodiment, the support ring 18, which may generally act as a base for the wafer boat, may have a bigger diameter than the alignment ring 22. Having a bigger diameter means the support ring 18 may provide more stability to the wafer boat 10.

In an embodiment the support ring 18 and the alignment ring 22 may be made of quartz.

The wafer boat 10 and alignment system may need to be able to withstand high temperature differences which may lead to high stresses in wafer boat material. Quartz may be well suited to meet that demand. Besides the alignment ring 22 and the support ring 18, also other parts of the wafer boat 10 may be made of quartz. Such as possibly the posts 32, top plate 36 and/or bottom plate 38.

The present disclosure may also provide an assembly 10, 12 for aligning and rotating wafer boats 10. The assembly 10, 12 may comprise a wafer boat 10 according to the description, and a pedestal 12. The pedestal 12 may comprise a substantially flat support surface 14 and may comprise either a plurality of alignment elements 24 protruding upwards from said support surface 14 configured to be accommodated in the plurality of alignment openings 26 in the alignment ring 22, or a plurality of alignment openings 26 configured to accommodate therein the plurality of alignment elements 24 on the alignment ring 22.

The effects and advantages of the assembly 10, 12 are similar to the advantages described above in relation to the wafer boat 10 and these effects and advantages are inserted here by reference.

In an embodiment the alignment elements 24 may be pins which may extend upwardly from the pedestal support surface 14.

The assembly may thus provide a pin and opening, or pin and slot combination with which the wafer boat 10 and the pedestal 12 may be aligned.

The present disclosure may further provide a vertical batch furnace assembly for processing wafers. The vertical batch furnace assembly may comprise a process chamber, a wafer handling space, and a wafer boat handling device. The process chamber may be configured to apply a thermal or chemical treatment to a batch of wafers. The wafer handling space may be provided with the assembly 10, 12 according to the description. The wafer boat handling device may be configured to transfer the assembly 10, 12 between the wafer handling space and the process chamber.

The effect and advantages of the vertical batch furnace assembly are similar to the advantages described above in relation to the assembly 10, 12 and the wafer boat 10 and these effect and advantages are inserted her by reference.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this description are not necessarily all referring to the same embodiment.

Furthermore, it is noted that particular features, structures, or characteristics of one or more of the various embodiments which are described above may be used implemented independently from one another and may be combined in any suitable manner to form new, not explicitly described embodiments. The reference numbers used in the detailed description and the claims do not limit the description of the embodiments, nor do they limit the claims. The reference numbers are solely used to clarify.

LEGEND

10—wafer boat
12—pedestal
14—support surface
16—central wafer boat axis
18—support ring
20—bottom end surface
22—alignment ring
24—pin
26—slot
28—inner radius (of the support ring)
30—outer radius (of the support ring)
32—slot axis
32—post
34—slit
36—top plate
38—bottom plate

The invention claimed is:

1. A wafer boat configured to support a plurality of wafers and to be placed on a pedestal of a vertical batch furnace, the pedestal having a substantially flat support surface, wherein the wafer boat defines a central wafer boat axis which, when the wafer boat is placed on the pedestal, extends substantially vertically, wherein the wafer boat comprises:

a support ring defining a bottom end surface of the wafer boat which is substantially flat, wherein the support ring is annular and has an inner radius and an outer radius; and an alignment ring substantially concentric with the support ring, the alignment ring including a second inner radius that is less than the inner radius of the support ring, the alignment ring disposed above the support ring, wherein either the support surface of the pedestal, or a bottom side of the alignment ring is provided with a plurality of alignment elements respectively protruding upwards from the support surface or downwards from the alignment ring, and wherein the other one of the support surface and the alignment ring is provided with a plurality of alignment openings configured to accommodate therein the plurality of alignment elements, and wherein the support ring downwardly protrudes beyond the alignment ring in the direction of the central wafer boat axis so that, when the wafer boat is placed on the pedestal, the support ring is supported on the support surface while the alignment ring is spaced from the support surface of the pedestal.

2. The wafer boat according to claim 1, wherein the difference between the inner radius and the outer radius is less than 10 mm.

3. The wafer boat according to claim 1, wherein the support ring and the alignment ring are integrally formed.

4. The wafer boat according to claim 1, wherein the alignment elements are provided on the support surface of the pedestal and the plurality of alignment openings are provided in the alignment ring and extend through the support ring.

5. The wafer boat according to claim 1, wherein the plurality of alignment openings are embodied as a plurality of slots through the alignment ring and extend through the support ring.

6. The wafer boat according to claim 5, wherein each slot is a substantially straight slot, having a slot axis, wherein each slot axis extends through a center point of the alignment ring and the support ring and extends radially outwardly.

7. The wafer boat according to claim 6, wherein the plurality of slots comprises three slots which are circumferentially spaced over intermediate angles of substantially 105° to 135° along the circumference of the alignment ring.

8. The wafer boat according to claim 7, wherein the intermediate angles are substantially 110°, substantially 120°, and substantially 130°.

9. The wafer boat according to claim 1, wherein the alignment elements are provided on the alignment ring, and the plurality of alignment openings are embodied as slots in the support surface.

10. The wafer boat according to claim 5, wherein a width of each slot is such that each alignment element snugly fits within its respective slot so that radial movement of the element in the associated slot is possible and movement of the element in a tangential direction of the alignment ring is prevented.

11. The wafer boat according to claim 1, further comprising at least two posts which are connected to, and extend upwardly from the alignment ring parallel to the central wafer boat axis, wherein each post comprises a plurality of slits for supporting a plurality of wafers.

12. The wafer boat according to claim 11, further comprising a top plate which is connected to upper ends of the at least two posts.

13. The wafer boat according to claim 11, comprising a bottom plate which extends inwardly from the alignment ring and which is concentric with the alignment ring.

14. The wafer boat according to claim 13, wherein the support ring, the alignment ring, and the bottom plate are integrally formed.

15. The wafer boat according to claim 1, wherein the support ring and the alignment ring are made of quartz.

16. An assembly for aligning and rotating wafer boats, the assembly comprising:
   a wafer boat according to claim 1; and
   the pedestal.

17. The assembly of claim 16, wherein the alignment elements are pins extending upwardly from the pedestal support surface.

18. A vertical batch furnace assembly for processing wafers, comprising:
   a process chamber configured to apply a thermal or chemical treatment to a batch of wafers;
   a wafer handling space provided with the assembly according to claim 17; and
   a wafer boat handling device configured to transfer the assembly according to claim 17 between the wafer handling space and the process chamber.

* * * * *